United States Patent
Kölker et al.

(10) Patent No.: US 12,221,687 B2
(45) Date of Patent: Feb. 11, 2025

(54) MULTI-LAYER COATING

(71) Applicant: CemeCon AG, Würselen (DE)

(72) Inventors: Werner Kölker, Herzogenrath (DE); Stephan Bolz, Aachen (DE); Oliver Lemmer, Aachen (DE)

(73) Assignee: CemeCon AG, Würselen (DE)

( * ) Notice: Subject to any disclaimer, the term of this patent is extended or adjusted under 35 U.S.C. 154(b) by 164 days.

(21) Appl. No.: 17/642,462

(22) PCT Filed: Sep. 8, 2020

(86) PCT No.: PCT/EP2020/075095
§ 371 (c)(1),
(2) Date: Mar. 11, 2022

(87) PCT Pub. No.: WO2021/048136
PCT Pub. Date: Mar. 18, 2021

(65) Prior Publication Data
US 2022/0307123 A1  Sep. 29, 2022

(30) Foreign Application Priority Data

Sep. 12, 2019 (DE) .................... 10 2019 124 616.4

(51) Int. Cl.
| | | |
|---|---|---|
| C23C 14/34 | (2006.01) | |
| C23C 14/02 | (2006.01) | |
| C23C 14/06 | (2006.01) | |
| C23C 14/35 | (2006.01) | |
| C23C 14/56 | (2006.01) | |
| C23C 14/58 | (2006.01) | |
| H01J 37/34 | (2006.01) | |

(52) U.S. Cl.
CPC .......... *C23C 14/345* (2013.01); *C23C 14/022* (2013.01); *C23C 14/0652* (2013.01); *C23C 14/0664* (2013.01); *C23C 14/067* (2013.01); *C23C 14/3485* (2013.01); *C23C 14/352* (2013.01); *C23C 14/56* (2013.01); *C23C 14/5833* (2013.01); *H01J 37/3405* (2013.01); *H01J 37/3467* (2013.01); *H01J 2237/332* (2013.01)

(58) Field of Classification Search
None
See application file for complete search history.

(56) References Cited

U.S. PATENT DOCUMENTS

| | | | |
|---|---|---|---|
| 5,330,853 A * | 7/1994 | Hofmann | ............ C23C 14/0084 51/307 |
| 7,989,093 B2 | 8/2011 | Myrtveit | |
| 8,173,278 B2 | 5/2012 | Cremer | |
| 9,812,299 B2 | 11/2017 | Cremer et al. | |
| 2010/0103564 A1 | 4/2010 | Nishioka et al. | |
| 2017/0287578 A1 | 10/2017 | Brechet et al. | |
| 2018/0040346 A1 | 2/2018 | Moriya et al. | |
| 2019/0088457 A1 | 3/2019 | Babayan et al. | |

FOREIGN PATENT DOCUMENTS

| | | | |
|---|---|---|---|
| CN | 101426947 A | 5/2009 | |
| CN | 101691654 A | 4/2010 | |
| CN | 109518144 A | 3/2019 | |
| EP | 2042261 A2 | 4/2009 | |
| EP | 2272080 B1 | 8/2012 | |
| JP | H09118973 A | 5/1997 | |
| JP | 2011518950 A | 6/2011 | |
| JP | 2015501371 A | 1/2015 | |
| WO | 2009132822 A2 | 11/2009 | |
| WO | 2013045454 A2 | 4/2013 | |
| WO | WO-2017089597 A1 * | 6/2017 | ........... C23C 14/022 |

OTHER PUBLICATIONS

International Search Report mailed Mar. 1, 2021, issued in corresponding Application No. PCT/EP2020/075095, filed Sep. 8, 2020, 9 pages.

International Preliminary Report on Patentability mailed Mar. 15, 2022, issued in corresponding Application No. PCT/EP2020/075095, filed Sep. 8, 2020, 8 pages.

Di Chen, Jin. "Modern Mold Manufacturing Technology." Publisher Mechanical Industry Press (Chinese Edition). Apr. 1, 2002. Publication Date: 2000.

* cited by examiner

*Primary Examiner* — Jason Berman

(74) *Attorney, Agent, or Firm* — CHRISTENSEN O'CONNOR JOHNSON KINDNESS PLLC

(57) ABSTRACT

The invention relates to a method for coating a substrate 40, a coating system for carrying out the method, and a coated body. In a first method step 62, the substrate 40 is pretreated in a ion etching process. In a second method step 64, a first coating layer 56a with a thickness of 0.1 μm to 6 μm is deposited on the substrate 40 by means of a PVD process. In order to achieve a particularly high-quality and durable coating 50, the surface of the first coating layer 56a is treated by means of an ion etching process in a third method step 66, and an additional coating layer 56b with a thickness of 0.1 μm to 6 μm is deposited on the first coating layer 56a by means of a PVD process in a fourth method step 68. The coated body comprises at least two coating layers 56a, 56b, 56c, 56d with a thickness of 0.1 μm to 6 μm on a substrate 40, wherein an interface region formed by ion etching is arranged between the coating layers 56a, 56b, 56c, 56d.

8 Claims, 7 Drawing Sheets

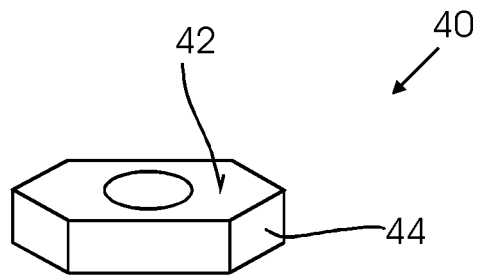
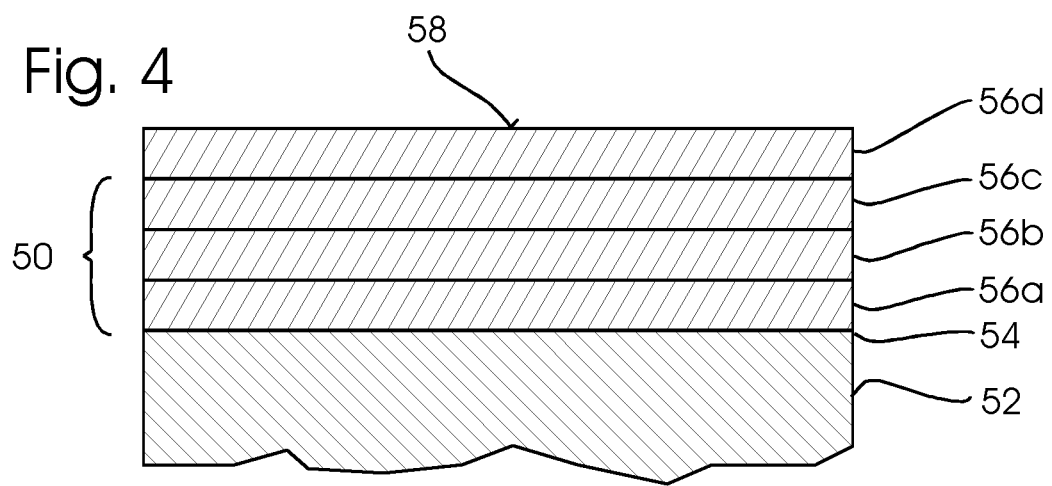

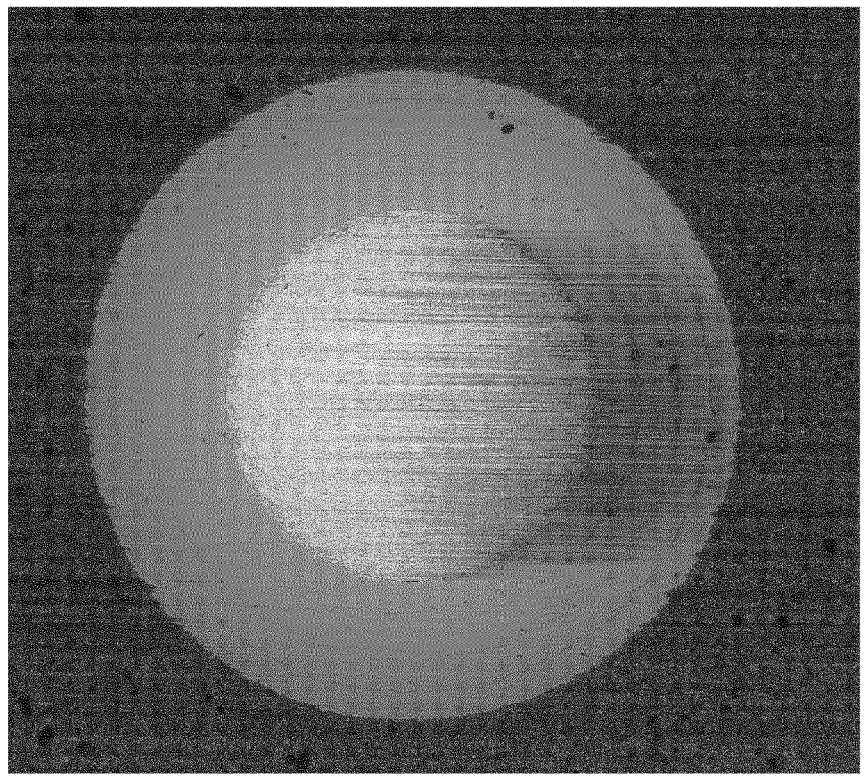
Fig. 7a
Fig. 7b
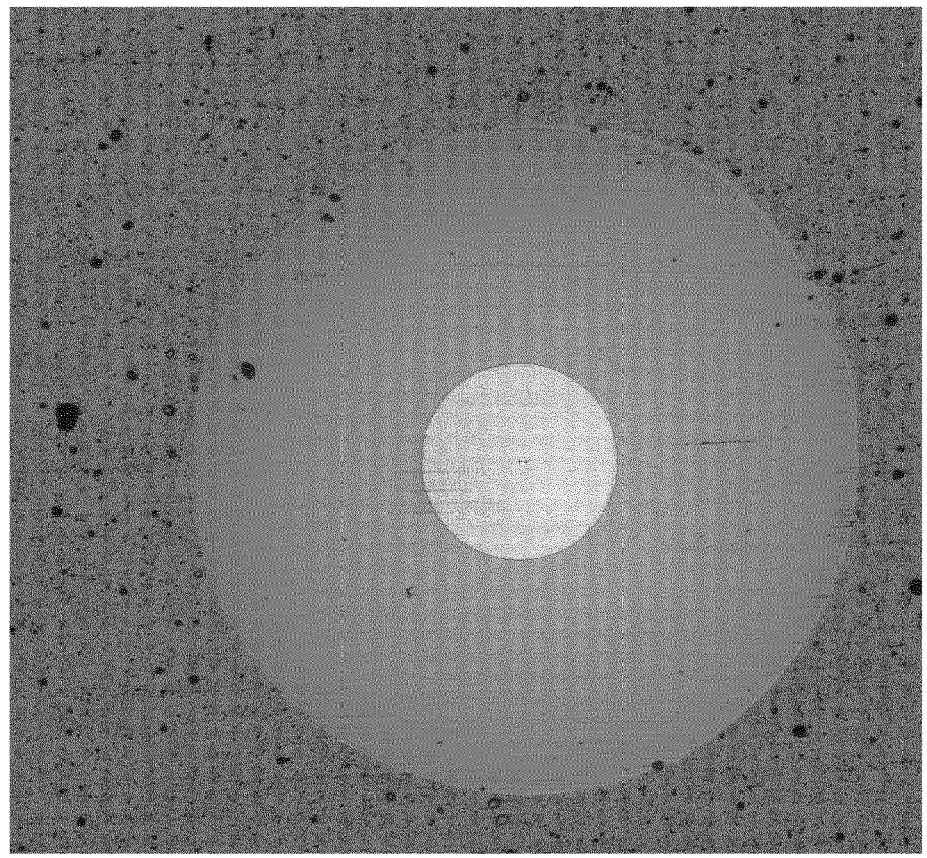

MULTI-LAYER COATING

FIELD OF THE INVENTION

The invention relates to a method for coating a substrate, a coating system for carrying out the method, and a coated body.

BACKGROUND OF THE INVENTION

It is known to provide bodies or parts of bodies with a surface coating in order to improve their properties. For tools in particular, it is known to provide functional surfaces with a hard material coating.

One class of known methods for applying hard material coatings is that of PVD (physical vapor deposition) methods, which include cathode sputtering and arc sputtering, for example. In these methods, coatings consisting of sputtered target materials are deposited on substrates.

In this connection, it is known to pretreat the substrate prior to application of a coating in order to achieve good coating adhesion, in particular. Aside from chemical and mechanical pretreatment steps, an ion etching step—in which ions are accelerated towards the substrate by means of an acceleration voltage, thereby producing an etching effect on the substrate surface—is suitable for pretreating the substrate, for example a hard metal or steel substrate.

WO 2009/132822 A2 describes a device and a method for pretreating and coating bodies by means of magnetron sputtering. The device comprises a vacuum chamber having a metal chamber wall and magnetrons with sputtering targets arranged therein. At least one of the magnetrons is provided for operation according to high-power pulsed magnetron sputtering (HPPMS, also referred to as HIPIMS). Electrical pulses are fed to a HPPMS magnetron in that a capacitive element is connected to the sputtering target by means of a switching element. In the method, a body to be coated is arranged in the vacuum chamber of the device and a plasma is generated during operation of the HPPMS magnetron. In an etching step, a negative bias voltage is applied to the body and the body is etched by bombardment with metal ions. Subsequently, the bias voltage is continuously lowered such that the material sputtered from the sputtering targets produces a layer build-up on the body.

DE 10 2006 019 000 A1 describes an apparatus and a method for plasma-enhanced deposition of hard material coatings, in particular for producing titanium-aluminum-nitride layers. Substrate supports that can rotate about a central axis are arranged in a vacuum chamber. At least one vaporization source and at least one hollow cathode are arranged radially outside the substrate support. The line between the hollow cathode it and the associated anode is offset by 15° to 70° with respect to the line between the target of the vaporization source and the axis in the plane at a right angle to the axis. The arc discharge of the hollow cathode is maintained parallel to the axis and to the vaporization of target material from the vaporization source. A target having a Ti:Al ratio of 1:1 is used in order to produce a titanium-aluminum-nitride coating having a Ti:Al ratio of 50:50 to 40:60 within a reactive nitrogen atmosphere.

SUMMARY OF THE INVENTION

It can be considered an object to specify a coated body as well as a method for coating a substrate and a coating system for carrying out the method, in which particularly high-quality and durable coatings can be achieved.

This object is solved by a method a coating system, and a coated body according to the claims. Dependent claims refer to advantageous embodiments of the invention.

It has been shown that coatings applied in PVD methods can have varying properties depending on the coating thickness. In particular, a longer coating duration and greater coating thickness has frequently been shown to increase the roughness and residual stresses in the coating, for example. Therefore, a fundamental concept of the present invention is not to generate a coating in a continuous manner, but rather to interrupt the growth of the coating in a targeted manner once or multiple times and then to restart same.

The method according to the invention initially provides, in a first method step, for pretreatment of the substrate by an ion etching process. Here, ions are generated, e.g. gas or preferably metal ions, and accelerated by means of a bias voltage towards the substrate surface. On account of the impinging ions, an etching effect, which may involve activation of the substrate surface, surface material removal and implantation of ions, is produced throughout an exposure time.

In a second step of the method according to the invention, a first coating layer with a thickness of 0.1 µm to 6 µm is deposited on the substrate by means of a PVD process. Magnetron sputtering is used as the coating method. The coating procedure is carried out for a selected coating duration such that the first coating layer is deposited on the substrate surface.

According to the invention, the application of the coating in the second step is interrupted by a third method step, which is another etching step. In the third method step, according to the invention, the surface of the previously produced first coating layer is treated by means of an ion etching process. The ion etching process of the third method step may preferably be the same type of process as in the first method step; the method parameters used, in particular the etching duration and the bias voltage may be selected so as to be the same or different from one another.

By using the etching process in the third method step, the layer growth is initially interrupted. A more or less substantial amount of layer material may be removed depending on the intensity of the etching step. In addition, the etching process leads to nucleation of the surface due to the introduction of microdefects.

In a fourth method step that follows on from this according to the invention, a further coating layer with a thickness of 0.1 µm to 6 µm is deposited by means of a PVD cathode sputtering process on the first coating layer or on the surface thereof prepared by means of the previous etching step. Preferably, in the fourth method step, the same type of coating method is used as in the second method step. In both steps, individual or all method parameters can be selected so as to be the same or different from one another.

The method according to the invention therefore comprises a sequence of steps—coating, etching, coating—which can also be referred to as a "repeat-start" procedure.

Surprisingly, it has been found that the repeat-start procedure, i.e. interrupting the coating process with ion etching and subsequently continuing with the coating, produces a structural change in the multi-layer coating compared with a single-layer coating applied in one go without the formation of the coating being interrupted by the intermediate etching step. A microstructure created during formation of the coating can be interrupted at least in part by the intermediate etching step, such that there is no seamless continuation of the previous growth in the subsequent coating step, but rather new growth nuclei are formed, for example.

Whereas a continuous coating process can, under certain circumstances, cause the coating morphology to become coarser in the direction of growth, this effect can be reduced or even completely reversed by means of the intermediate etching step. As such, it is possible to achieve a coating morphology in which the layer structure of the additional coating layer applied after the intermediate etching step is finer than that at the surface of the previous coating layer at least at the start, i.e. adjacent to the interface region to the previous coating layer.

In particular, an effect can be produced on residual stresses in the coating produced. The residual stresses in the coating can increase with increasing coating duration and thickness. It has been shown that, in the case of interrupting and restarting the coating within the scope of the repeat-start procedure, the residual stresses in the multi-layer coating do not increase to the same extent as in the case of a single-layer coating. As a result, coatings with overall lower residual stresses are Obtained by using the repeat-start method in the case of longer coating durations and greater coating thicknesses. Coatings with lower residual stresses have more favorable ductility properties and better adhesion to the substrate.

It has been shown that, by interrupting the growth once or multiple times, overall, layers which have a smaller number of defects and which are thus denser and less porous can be produced. On the one hand, this can result in a smoother layer surface. On the other hand, a denser layer has significant advantages with regard to chemical resistance, since the denser structure means that there are fewer diffusion paths, e.g. for atmospheric oxygen to undesirably diffuse in during use, which can lead to failure of the coating.

As would be obvious to a person skilled in the art, it is possible to modify the above-mentioned sequence of the first to fourth steps, for example by subdividing a coating or etching step into multiple substeps with different coating or etching parameters or by means of temporally intercalated method steps involving other treatment measures, for example heat treatment (annealing) or chemical treatment (e.g. oxidation, carburization), etc. However, the basic pattern, i.e. the sequence of the first to fourth steps, always remains the same.

While advantages of the repeat-start procedure already become apparent after a single application, multiple applications can show particular advantages. For example, following on from the fourth method step, the surface of the uppermost coating layer may be treated by means of the ion etching process and, subsequently, an additional coating layer may be deposited on the underlying coating layer by means of the PVD cathode sputtering process. This can be repeated once or multiple times, thus producing at least three or four coating layers, for example. The total number of repetitions of the repeat-start sequence can, for example, be selected according to type and desired thickness such that 2 to 50 coating layers are formed, preferably 3 to 20, more preferably 3 to 10 or 3 to 5.

In principle, the advantages of interrupting and subsequently continuing the growth of the coating can also be harnessed if individual or even all of the method steps are carried out so as to be spatially and/or temporally separate from one another, e.g. at separate locations and in separate treatment or coating systems, if applicable after intermediate storage, etc. However, the application of the method steps is particularly efficient within the same coating system, in particular the same vacuum chamber. Preferably, the application of two or more of the above-mentioned method steps takes place without the vacuum being interrupted, for example the application of the repeat-start steps (second method step—coating, third method step—ion etching, fourth method step—coating), in particular preferably the first to fourth step.

Preferably, more than one or all of the method steps can be performed in the same vacuum chamber of a coating system and/or using the same electrodes (e.g. cathodes and/or electrical connection to the substrate or holder), wherein merely electrical power supplies and/or means for: altering the pressure or atmosphere are switched over in order to perform the different method steps without retooling of the equipment. However, various magnetron cathodes (e.g. HIPIMS cathodes and DC cathodes) may also be arranged within the same vacuum chamber, for example, and may then be actuated differently in the method steps or even switched off in individual method steps. Equally, cathodes equipped with different targets may be used. In this way, in successive method steps, differing process parameters can be achieved by means of purely external control without the system equipment having to be retooled between the method steps or without the vacuum having to be interrupted.

As with the temporally intercalated etching steps, the coating steps may also be the same or different from one another, for example in terms of duration of application and/or process parameters such as pressure, atmospheric composition, target materials, voltage/electrical power, etc.

Preferably, a negative bias voltage is applied to the substrate both during the coating steps—i.e. the second and fourth method step and, if applicable, additional method steps in which a coating layer is produced by means of PVD magnetron sputtering—and during the etching step or etching steps. In this connection, the bias voltage is preferably higher in the third method step than in the second and fourth method step. By means of a higher bias voltage, ions of the plasma are accelerated more strongly onto the substrate, and therefore ion etching takes place at a higher bias voltage. As a result, it is possible to switch between the operating modes of coating and etching by changing the bias voltage.

According to a preferred embodiment of the invention, in addition to the second and fourth method step, additional coating steps may optionally also be performed in order to produce a respective coating layer with a thickness of 0.1 μm to 6 μm, preferably 0.5 μm to 5 μm, more preferably 1 μm to 4 μm. Particularly preferably, the thicknesses of at least two successive coating layers differ from one another by less than +/−50%, more preferably by less than +/−25%, particularly preferably by less than +/−15% (in each case relative to the thinner coating layer). More preferably, this applies to all coating layers produced in the repeat-start process.

By virtue of the method according to the invention, coatings with a total thickness of 12 μm or more, preferably 3 μm or more are produced.

For such thick coatings particular advantages of the method according to the invention arise. The total thickness may be up to 30 μm.

Continuous production of single-layer coatings with such thicknesses by means of a PVD coating method often results in such coarse structures and/or high residual stresses that the coatings can no longer be used for many applications, for example due to insufficient coating adhesion and/or excessive roughness. Surprisingly, these disadvantages can be prevented by subdividing the thick coatings into, for example, two or more, preferably three or more coating layers.

For at least one, preferably all of the method steps with application of a coating (i.e. the second, fourth and/or one or more additional method steps), a cathode sputtering method, in which at least one target of at least one magnetron cathode is sputtered, is used.

Although a DC voltage, AC voltage or pulsed voltage, for example, can be applied to a cathode in this method, a HIPIMS method is particularly preferred. This is a class of methods which can also be referred to as "high-power pulsed magnetron sputtering" and in which the magnetron cathodes are supplied with electrical power in the form of very short but extremely high energy pulses, as a result of which a high ion density can be achieved in the coating particles in front of the magnetron cathodes. A high peak power of, for example, 60 W/cm$^2$ or more, preferably 100 W/cm$^2$ or more, particularly preferably 200 W/cm$^2$ to 2,300 W/cm$^2$ (per cathode, related to the target surface area of the respective cathode) during a pulse is characteristic of the HIPIMS method. In addition, a duty cycle, i.e. the ratio of pulse duration to the pulse spacing, is typically less than 0.5, i.e. the pulse spacing is longer than the pulse duration. Devices and methods for operating magnetron cathodes by means of HIPIMS are disclosed, for example, in WO 2009/132822 A2 by the applicant. A HIPIMS coating method is preferably understood to mean that one, multiple or all cathodes in the vacuum chamber of a coating system are operated with high-power pulses in accordance with the HIPIMS method, wherein it is possible to simultaneously operate additional cathodes in DC mode, if required.

The pulse durations preferably used in the HIPIMS method may for example be 5 to 200 µs. The HIPIMS pulses may preferably be generated at frequencies of, for example, 100 to 10,000 Hz, particularly preferably 2,000 to 6,000 Hz.

In one or more of the coating steps, a bias voltage is preferably applied to the substrate, in particular a negative bias voltage, such that positively charged ions are accelerated towards the substrate surface. In particular, when magnetron sputtering is used, for example with a DC voltage, pulsed DC voltage or HIPIMS pulses at at least one magnetron cathode, the bias voltage may be a constant or pulsed DC voltage. A pulsed DC voltage is preferably pulsed in a unipolar manner. The pulse frequency may be in the MF (medium-frequency) range, for example 50 kHz to 3 MHz, preferably 100 kHz to 1 MHz, particularly preferably 150 to 500 kHz.

However, according to a preferred embodiment, the HIPIMS coating method is carried out with the application of a pulsed bias voltage to the substrate. Preferably, in this case, the bias pulses may be temporally synchronized with the HIPIMS pulses applied to a cathode. "Synchronized" should be understood to mean that the pulses of the bias voltage (bias pulses) are applied at the same frequency as the HIPIMS pulses at one or more cathodes, or that the frequencies are integer multiples of one another. In the case of multiple HIPIMS cathodes that are controlled such that HIPIMS pulses are not applied at the same time but rather successively, the pulse frequency of the bias pulses preferably at least corresponds to the HIPIMS pulse frequency multiplied by the number of HIPIMS cathodes.

In this connection, the HIPIMS pulses and the bias pulses may be temporally synchronized such that they have the same duration and start at the same time. Preferably, however, the duration may also differ and/or a lead or delay time (offset) of the bias pulse with respect to the relevant HIPIMS pulse may be specified. Particularly preferably, the synchronization is such that the bias pulse occurs with a delay (offset) of, for example, 5 µs or more with respect to the assigned HIPIMS pulse, preferably 20 to 50 µs or more. Furthermore, the synchronization is preferably such that the bias pulse in each case has a lag time after the assigned HIPIMS pulse of, for example, 5 µs or more, preferably 10 µs or more.

It has been shown that, when a HIPIMS pulse is applied, different types of ions occur at different times, in particular metal and gas ions. Gas ions are often observed in large numbers in an early phase at the beginning of the HIPIMS pulse, whereas an occurrence of a higher density of metal ions can be observed with time delay. By delaying the bias pulse with respect to the HIPIMS pulse in a targeted manner, it is possible to accelerate preferably metal ions and fewer gas ions towards the substrate by means of the applied bias voltage. It has been shown that the implantation of gas ions in the forming coating contributes significantly to an increase in residual stresses in the coating. A coating with low residual stresses can be obtained by temporally synchronizing the bias pulse with the cathode pulse such that the voltage of the bias pulse is applied during a time interval rich in metal ions.

Various constituents can be considered for the composition of the coating or each coating layer. On the one hand, these include one or more target materials that are released by means of sputtering. On the other hand, constituents may be supplied in gaseous form. In particular, coating may take place in a reactive coating process, for example by supplying reactive gas that contains nitrogen, oxygen and/or carbon.

Preferably, the coating is a hard material coating. Each coating layer may, for example, consist of a material system that comprises one or more metallic elements, or preferably at least one metallic element and at least one non-metallic element. It may, in particular, be composed of one or more metallic elements and one or more non-metallic elements. Binary, tertiary and quaternary hard substances, i.e. those with two, three or four different metallic elements, are preferred. In this connection, compositions in which the metallic element or the metallic elements are selected from the group comprising Al, Si, B and elements of groups 4 to 6 of the IUPAC periodic table (1988) are preferred. (The semi-metals Si and B are considered metallic elements in this context for the sake of simplicity.) Particularly preferably, Ti is contained in the composition as one of the metallic elements. The non-metallic elements may, for example, be selected from the group comprising C, N and O, preferably from the group comprising C and N, particularly preferably N is provided as the only non-metallic element.

In the following examples, the compositions of coatings are either directly referred to as chemical compounds or phases, or as material systems. In this connection, material systems are specified with a list of the elements contained therein, each separated from one to another by a dash, wherein the metallic elements are indicated first followed by the non-metallic elements. The metallic and non-metallic elements are preferably in each case named in the order of their proportions (in atomic percent). The name of the material system may correspond to the chemical compound, but this is not always the case. For example, the material system Ti—C will contain the hard material compound TiC or consist entirely thereof, whereas the material system Ti—B comprises or consists of the hard material compound TiB$_2$. Preferred material systems include, for example, Al—Ti—N, Ti—B, Ti—C—N, Al—Ti—Cr—Si—N or Ti—Al—C—N. Metals, for example. Al, Ti, Si and/or Cr, are preferably provided in solid form as constituents of one or more cathode targets.

In a preferred embodiment, at least one coating layer, preferably multiple or all coating layers, are formed of $Al_x$—$Ti_{1-x}$—N, further preferably with $x \geq 0.4$ or $x \geq 0.5$, particularly preferably $0.55 \leq x \leq 0.65$. The Al portion x is preferably at most 70%.

At least two, preferably more or all of the coating layers of the coating formed during the coating steps may have the same elements, i.e. the same material system and, if applicable, the same relative proportions of the elements contained. Alternatively, it is also possible to specify different compositions for the coating layers.

The ion etching process in the first, third and/or in additional method steps may preferably be carried out by igniting a plasma by means of a cathode and applying a relatively high acceleration voltage (bias voltage) to the substrate. A plasma may mainly consist of gas ions, for example. Alternatively, cathodes may be operated with HIPIMS pulses in order to generate a plasma with a high quantity of metal ions. The bias voltage may preferably be a constant DC voltage or a unipolar or bipolar (MF-)pulsed DC voltage in a unipolar or bipolar manner.

As explained in the following based on an exemplary embodiment, the ion etching process may comprise multiple substeps, for example one etching substep in which a plasma is generated and a bias voltage in the form of a DC voltage pulsed in a bipolar manner at a medium frequency of, for example, 50 kHz to 1 MHz and with a pulse height of, for example, 100 V to 1,000 V, preferably 300 V to 800 V, is applied for a first period of time, and an additional etching substep in which, after a plasma has been generated, a bias voltage in the form of a DC voltage in the range of, for example, −50 V to −400 V, preferably −100 V to −300 V, is applied for a second period of time. The second period of time is preferably longer than the first period of time, further preferably at least twice as long. By way of example, the first period of time may be 5 to 30 minutes and the second period of time may be 30 to 200, preferably 40 to 150 minutes.

The two etching substeps differ in terms of their effect on the substrate, in particular on account of the utilization of electrical edge effects in the presence of DC bias. Etching with an MF-pulsed bias voltage has a substantially uniform effect on all surfaces of the substrate. In the case of etching with DC bias, edges are primarily etched, i.e. the cutting edges, in particular.

The parameters for the ion etching process in the first method step, in which the substrate is etched, may coincide with the parameters for the etching process in the third method step (and, if applicable, additional method steps, in which additional intermediate etching is carried out). Alternatively, it is also possible to use parameters that differ. For example, the substrate may be etched for longer in the first method step than the relevant surface of the coating layers is etched in a subsequent intermediate etching step. Further preferably, a lower bias voltage may be applied, for example, in the first method step than in other etching steps. The total amount of material removed in an intermediate etching step preferably corresponds to less than 20%, more preferably less than 10%, more preferably less than 5% or less, particularly preferably 2% or less of the thickness of the relevant coating layer.

The method according to the invention is particularly suited for producing a tool, in particular a tool having at least one cutting edge. In particular, it is preferably a drill, milling cutter or indexable insert, for example.

The coated substrate may consist of various materials, for example steel (HSS). Preferably, it is a hard metal, in particular WC/Co sintered material. Equally, the method according to the invention can also be applied to other types of substrate materials, for example cBN substrates or ceramic substrates.

According to a second aspect, the invention also relates to a coating system for carrying out the method according to the invention. Said system comprises a vacuum chamber and a device for arranging a substrate in the vacuum chamber, for example a substrate holder, preferably for rotating the substrate, particularly preferably for planetary rotation. Means for generating a plasma are provided in the vacuum chamber, preferably, magnetron cathodes that are connected to a suitable electrical power supply. Furthermore, means for generating a bias voltage on the substrate are provided, preferably an electrical power supply that is attached to the substrate. Both power supplies may be attached to a counter electrode, for example the chamber wall or a separate anode.

According to the invention, the coating system comprises control means for controlling the coating system in order to automatically carry out the method according to the invention. The control means may, for example, comprise a programmable computer having an operating program that prescribes the method steps according to the invention. In particular, the means for generating the plasma and/or the means for generating the bias voltage can preferably be controlled by the control means. The programming preferably comprises at least one loop for repeating programmed method steps, in order to realize the above-described repeat-start method.

According to a third aspect, in addition to the method according to the invention, the invention also relates to a coated body, preferably produced by means of the method according to the invention. The coated body according to the invention comprises a substrate and at least one coating applied thereto. The coating comprises at least two coating layers each with a thickness of 0.1 µm to 6 µm. An interface region formed by means of ion etching is arranged at least between two of the coating layers. At the interface region, the coating layers have a visible structural change, namely a different layer morphology directly adjacent to one another, due to the above-described interruption to the growth of the layer.

The coating may preferably comprise more than two coating layers each of 0.1 µm to 6 µm, between which interface regions formed by ion etching are arranged in each case.

According to claim 13, the morphology of the coating is such that, if—viewed in the direction of increasing distance from the substrate—a first and subsequent second coating layer are separated from one another by an interface region, the structure of the second coating layer adjoining the interface region is finer than the structure of the first coating layer adjoining the interface region. The interface region is therefore preferably characterized by a change in the coating morphology from a coarser to a finer morphology.

The morphology can be assessed in a manner known to a person skilled in the art, for example based on structure zone models, for example according to Thornton (Thornton, J.; 1974. Influence of apparatus geometry and deposition conditions in the structure and topography of thick sputtered coatings. Journal of Vacuum Science & Technology, Vol. 11, pp. 666-670).

Preferably, the coating overall has lower residual stresses compared with a coating of the same thickness which—under otherwise identical conditions—is deposited continuously, i.e. without interruption and without the formation of interface regions by means of ion etching.

BRIEF DESCRIPTION OF THE DRAWINGS

In the following, exemplary embodiments will be described in more detail with reference to the drawings, in which:

FIG. 3 shows an embodiment of a coated body in the form of an indexable insert;

FIG. 4 is a schematic sectional view of a coating of the coated body from FIG. 3 with multiple coating layers;

DETAILED DESCRIPTION OF EMBODIMENTS

Figure 1:
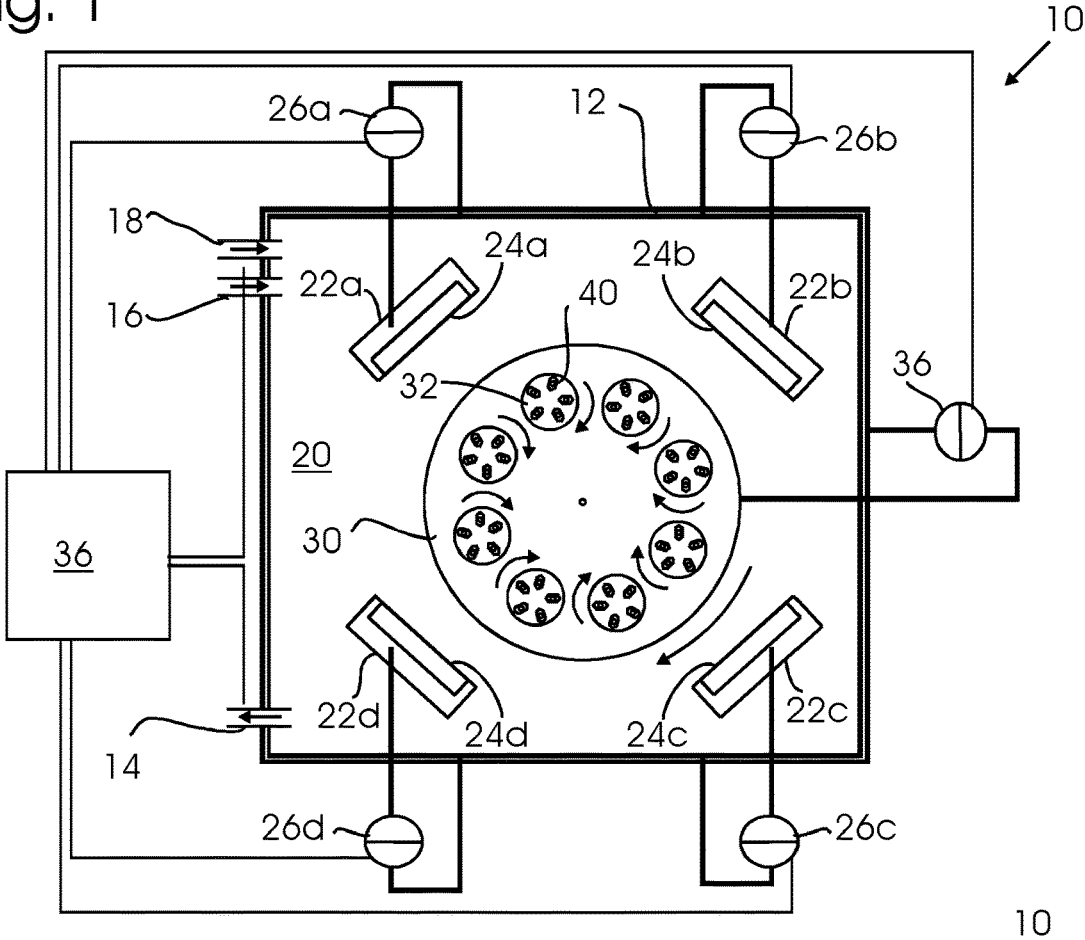
FIG. 1 is a schematic representation in top view of a coating system.
Figure 2:
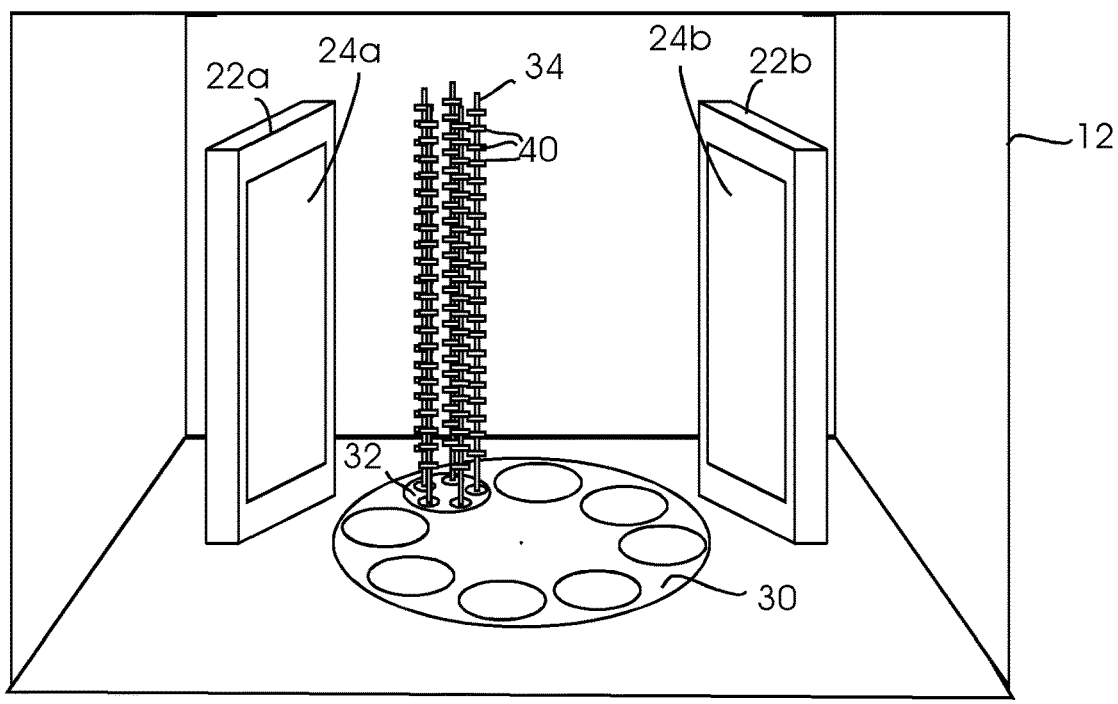
FIG. 2 is a schematic representation in perspective view of parts of the coating system from FIG. 1.

FIG. 1 and FIG. 2 show a PVD coating system 10 comprising a vacuum chamber 12. An interior 20 of the vacuum chamber 12 can be evacuated by means of a vent 14 in order to produce a vacuum. A process gas, preferably a noble gas or mixture of various noble gases, e.g. argon and/or krypton, can be fed in via an inlet 16. A reactive gas such as nitrogen can be fed in via an inlet 18. In alternative embodiments, the inlets 16, 18 may be replaced with a common inlet for a process gas and a non-combustible reactive gas.

Four magnetron cathodes 22a, 22b, 22c, 22d, each having plate-shaped sputter targets 24a, 24b, 24c, 24d, are arranged in the interior 20 of the vacuum chamber 12. FIG. 2 shows only two magnetron cathodes 22a, 22b for a better overview.

The magnetron cathodes 22a, 22b, 22c, 22d are oriented with their sputter targets 24a, 24b, 24c, 24d towards the center of the vacuum chamber 12. There is a rotatable substrate table 30 on which a number of rotatable substrate plates 32 having substrate holders 34 are arranged. In the example shown, indexable inserts 40 are loaded as substrates. The substrate holders 34 are upright, rod-like holders on which the indexable inserts 40 are placed. The indexable inserts 40 are electrically connected to the substrate table 30 via the substrate holders 34 and substrate plates 32. FIG. 2 shows only the substrate holders 34 of one substrate plate 32 for a better overview.

An indexable insert 40 is shown in FIG. 3. It comprises a rake face 42 and a flank face 44. In the arrangement shown in FIG. 2, the flank face 44 is arranged in parallel with the sputter targets 24a, 24b, 24c, 24d of the magnetron cathodes 22a, 22b, 22c, 22d. The edges between the faces 42, 44 are intended for use as cutting edges during machining. The indexable insert 40 consists of a WC/Co sintered hard metal.

The indexable insert 40 is merely an example of a substrate to be coated. Alternatively, components or tools of different shapes can be loaded on suitably shaped substrate holders 34 in each case.

The magnetron cathodes 24a, 24b, 24c, 24d are connected to a respective controllable electrical power supply 26a, 26b, 26c, 26d, by means of which an electrical voltage can be applied relative, to the electrically conductive wall of the vacuum chamber 12.

A controllable bias power supply 36 by means of which an electrical voltage relative to the wall of the vacuum chamber 12 can be applied to the substrate table 30, substrate holders 34 and substrates 40 is attached to the substrate table 30.

The power supplies 26a, 26b, 26c, 26d, 36 are, in this case, each shown merely schematically as controllable electrical voltage supplies. They may be conventional DC power supplies, pulsed power supplies and/or HIPIMS power supplies. In the example shown, the power supplies 26a, 26b, 26c, 26d are controlled such that they can switch between DC and HIPIMS operating modes. In alternative embodiments, respective dedicated DC and HIPIMS cathodes may be arranged inside the vacuum chamber 12 and be connected to dedicated DC and HIPIMS power supplies, which can then be activated or deactivated as desired upon actuation by means of the central control unit 36.

The power supplies 26a, 26b, 26c, 26d, 36 and pumps (not shown) at the inlets and outlets 14, 16, 18 are each attached to a central control unit 36 of the system 10. The central control unit 36 can be programmed such that all parameters of the pretreatment and coating methods taking place in the interior 20 of the vacuum chamber 12 are controlled by means of the control unit 36.

In the following, the sequence of a coating process programmed in the central control unit 36 will be explained by way of example:

Example: PVD Hard Material Coating With Large Thickness

A hard material coating with a particularly large thickness of more than 10 μm is to be applied in order to coat substrates such as the indexable insert 40. Coatings of this thickness usually cannot be applied with sufficient coating adhesion for machining applications.

Figure 5:
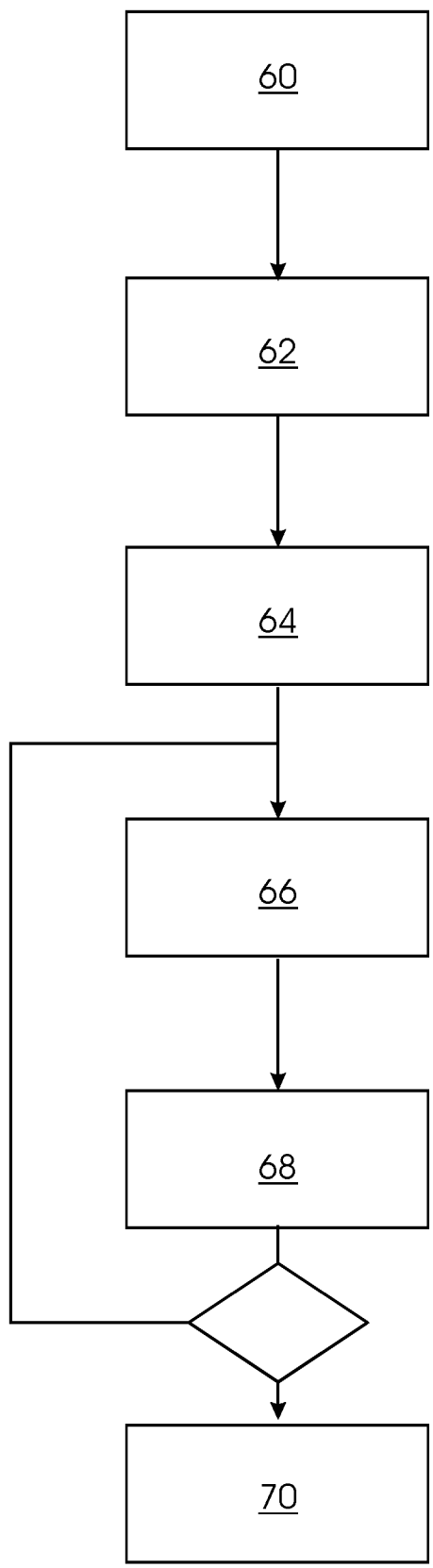
FIG. 5 is a flow diagram of an exemplary embodiment of a coating process.

FIG. 5 schematically shows a sequence of the coating process automatically prescribed by programming of the central control unit 36. Titanium plates are each provided with aluminum plugs as the sputter targets 24a, 24b, 24c, 24d inside the system 10. In a preparation step 60, the substrates 40 are charged inside the system to, and the vacuum chamber 12 is evacuated to a pressure of 350 mPa and heated.

Subsequently, the surface 54 of the hard metal material 52 of the substrates 40 is etched in a first etching step 62. In the example shown, the first etching step 62 is a combined etching step with a first and second etching substep, by means of which the substrate surface is cleaned and etched by means of gas ions.

In the first etching substep, ion etching takes place, wherein a plasma is initially ignited by means of the magnetron cathodes 22a, 22b, 22c, 22d.

The bias power supply 36 is thus actuated such that a bias voltage of −650 V and pulsed at medium frequency (240 kHz) in a bipolar manner against the chamber wall is applied to the substrate 40. In this way, gas ions of the plasma are accelerated onto the surface 54 of the substrate 40.

The first etching substep is applied for a period of approx. 15 minutes. This results in a low etch removal rate of 0.1 μm/h.

In the second etching substep, ion etching takes place again, wherein a plasma is again initially ignited by means of the magnetron cathodes 22a, 22b, 22c, 22d.

The bias power supply 36 is actuated for a treatment time of 60 minutes, with an argon/krypton mixture being supplied as the process gas, such that the substrate 40 is subjected to a constant DC bias voltage of −200 V with a negative potential.

The etch removal in the second etching substep is approx. 0.5 μm/h.

The etching step 62 is followed by a coating step 64 on account of switching on the part of the central control unit 36 and without the vacuum being interrupted, in which coating step the power supplies 26a, 26b, 26c, 26d of the magnetron cathodes 22a, 22b, 22c, 22d are actuated such that they are operated in HIPIMS mode with short, high voltage pulses. Each of the four magnetron cathodes 22a, 22b, 22c, 22d is supplied with a peak power of approx. 100 kW during the coating step 64.

The bias voltage supply 36 is actuated, such that a pulsed bias voltage of, for example, −50 to −150 V is applied, wherein the bias pulses are synchronized with the power pulses of the magnetron cathodes 22a, 22b, 22c, 22d. In this connection, the bias voltage is provided with an offset, such that the bias pulses start with a slight time delay with respect to the HIPIMS pulses.

During the coating time of approx. 100 minutes, nitrogen is fed in as the reactive gas in addition to argon/krypton as the process gas.

Figure 6:
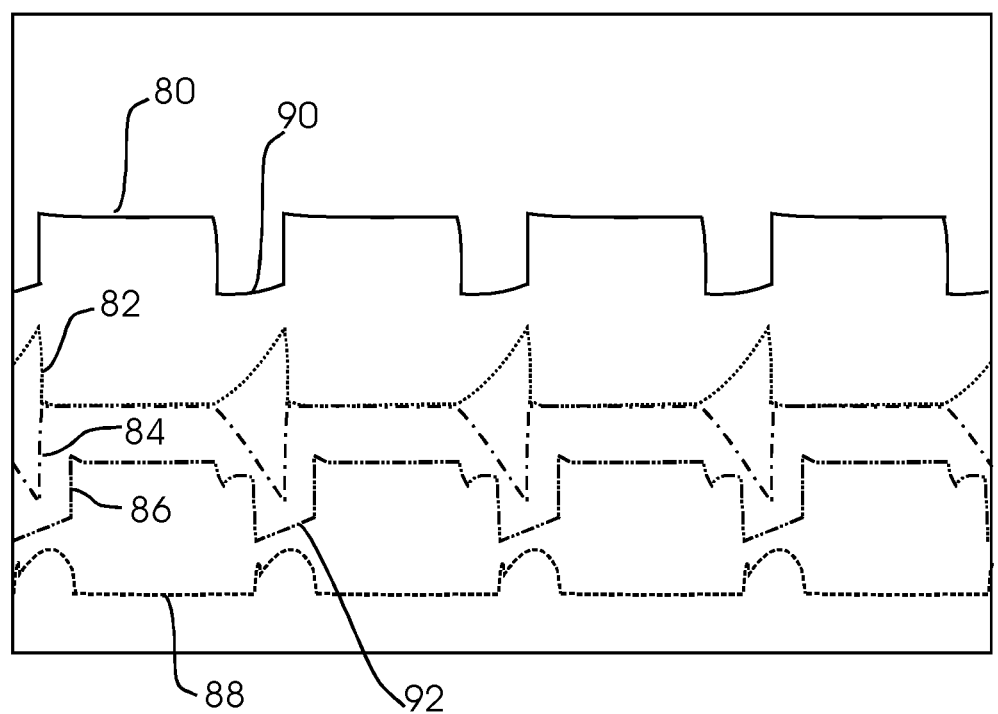
FIG. 6 is a graph showing the course of various electrical variables over time during a coating step.

FIG. 6 shows examples of time curves for various electrical variables during the coating step 64, namely for the voltage 80 at the magnetron cathodes 24a, 24b, 24c, 24d (solid line), the cathode current 82 (dotted line), the cathode peak power 84 (dashed-dotted line), the bias voltage 86 (the dashed-double dotted line) and the bias current 88 (dashed line). As is clearly visible, the voltage 80 is applied to the magnetron cathodes 24a, 24b, 24c, 24d in pulses 90, while the bias voltage 86 is applied in temporally trailing bias pulses 92.

FIG. 4 schematically shows the structure of a coating 50 on the hard metal substrate material 52. A first coating layer 56a is produced there in the coating step 64. The coating rate is approx. 2 μm/h, such that a thickness of the first coating layer 56a of approximately 3 μm is produced at the end of the coating step 64.

The material system of the first coating layer 56a is Al—Ti—N. An Al share x (among the metallic elements) of approximately 60% is achieved.

By delaying the bias pulses 92 with respect to the HIPIMS pulses 90, relatively few gas ions are implanted in the coating layer 56a, which thus has a relatively low residual stress.

An intermediate etching step 66 follows on from the coating step 64. In the example shown, the intermediate etching step 66 is performed using the same parameters as in the first etching step 62, i.e. with two successive etching substeps. As already mentioned, it is alternatively possible to perform the etching steps 62, 66 using different parameters, in particular with the intermediate etching step being of shorter duration than the first etching step 62.

The amount of material removed in the intermediate etching step 66 is significantly less than the values indicated above for the first etching step 62, since the etched coating layer 56a is harder than the substrate surface etched in the first etching step 62.

Subsequently, an additional coating step 68 follows. In the present example, the coating step 68 corresponds to the previous coating step 64 in terms of all parameters used. In the example shown, the coating step 68 is also performed for the duration as the previous coating step 64. Alternatively, different coating steps can be performed using different parameters, such that coating layers that differ, for example, in terms of thickness, structure and/or composition are produced.

In the current example, the cycle of coating/intermediate etching/coating, controlled by programming of the central control unit 36 in the form of a loop, is repeated until a total of four coating layers 56a, 56b, 56c, 56d are deposited one on top of the other in each case with intermediate etching of the underlying surface (FIG. 4). Afterwards, the substrates 40 are cooled in the subsequent step 70.

By interrupting the layer growth at the respective points by means of the intermediate etching steps 66, there is no continuation of the growth of crystallites after the subsequent coating step 68 is started again, but rather new crystallization nuclei are formed. Although the coating steps 64, 68 are each performed using identical parameters in the example given above, the resulting coating 50 has a structure with recognizably separate coating layers 56a, 56b, 56c, 56d.

FIG. 7a shows this with calotte grinding on the surface 44 of a coated body 40. The interface regions between the coating layers 56a, 56b, 56c, 56d and formed by means of the intermediate etching steps can be seen as rings. In contrast, FIG. 7b shows a continuously produced coating after calotte grinding without such rings.

Figure 7C:
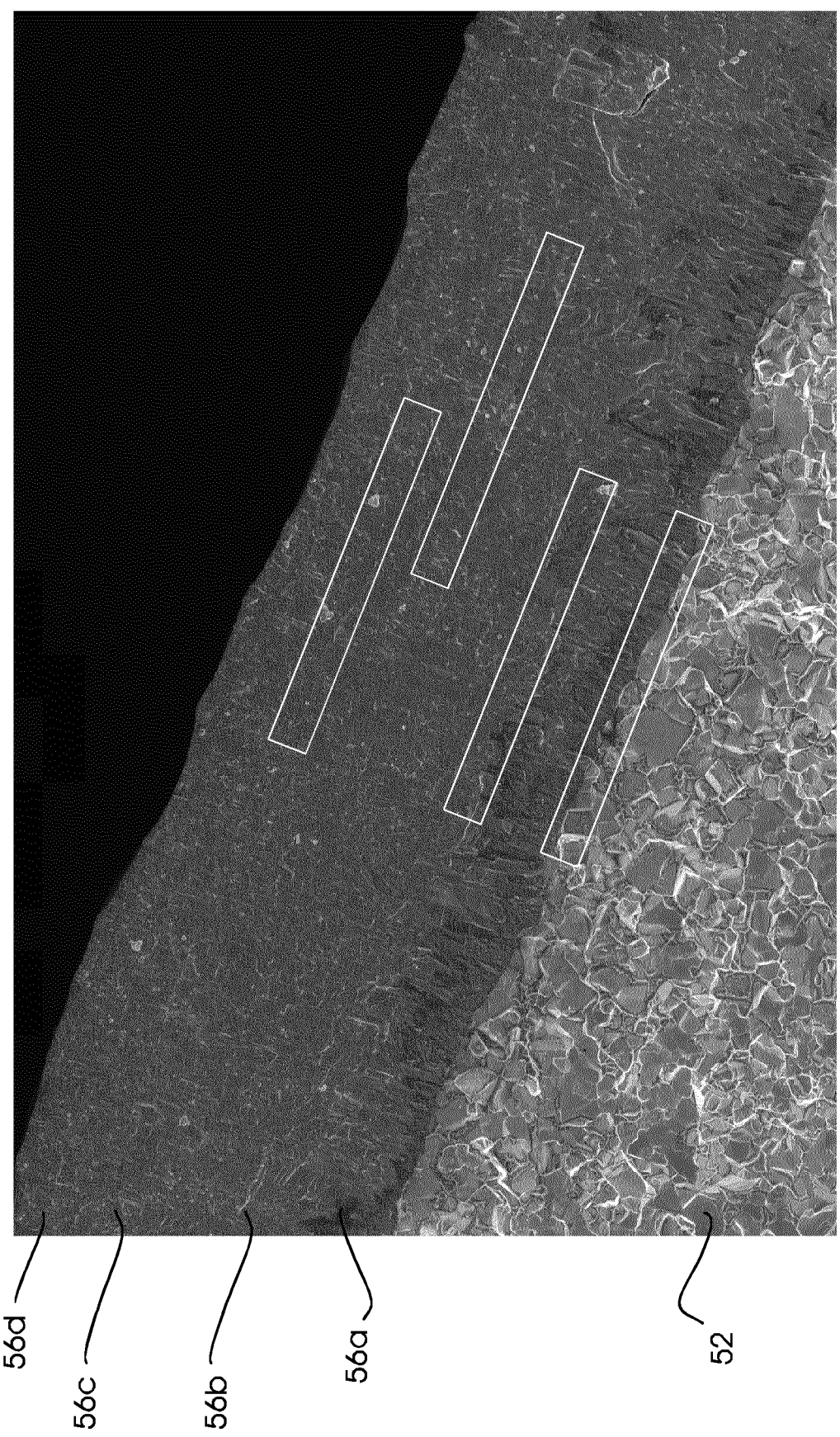
FIG. 7a is a photograph of a calotte grinding of a coating according to the exemplary embodiment.
FIG. 7b is a photograph of a calotte grinding of a coating according to a reference method.
FIG. 7 is an SEM image of a coating on a substrate.
FIG. 7d is an enlarged view of part of the SEM photo from FIG. 7c.
Figure 7D:
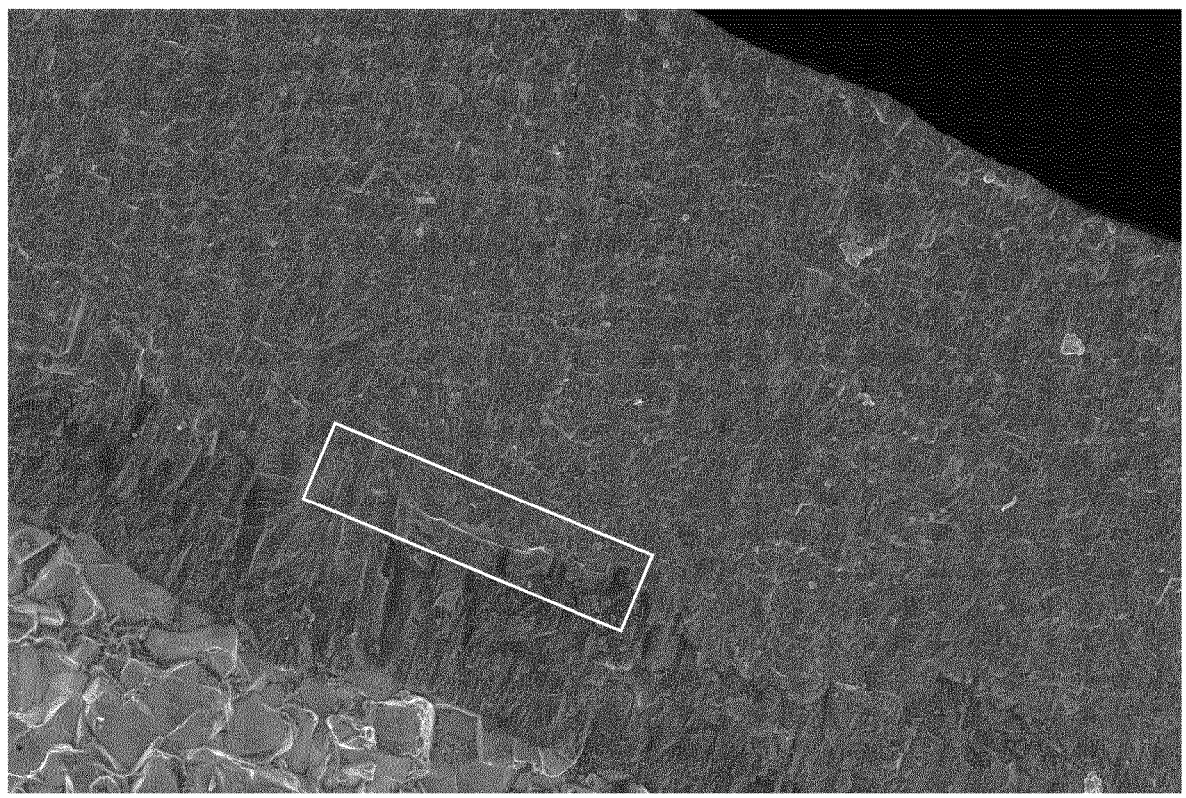

FIG. 7c is an SEM photo of the substrate material 52 with the coating layers 56a, 56b, 56c, 56d formed thereon. The interface regions are indicated by means of white frames. The respective change in coating morphology is difficult to discern in places at the magnification shown, but is clearer to see with a higher magnification (FIG. 7d). FIG. 7c and FIG. 7d show, the latter more clearly, that the coating morphology changes from a coarser structure to a substantially finer structure at least for the first interface region—viewed from the substrate surface. In the structure zone model according to Thornton, this corresponds to a change from structure zone 1 to structure zone T.

The surface of the coating 50 proves to be smooth, dense and largely free from pores. The tool 40 coated therewith therefore has a high resistance for different applications, in particular for machining purposes.

The coating 50 has a total thickness of approx. 12 μm. Whereas a reference coating applied using the same parameters but continuously exhibits very high coating residual stress and poor adhesion to the substrate material 52, the coating 50 with the same thickness only has a compressive stress of approx. −1.4 GPa and good coating adhesion.

Other possible embodiments can be taken from the table below, which specifies the coating materials, total coating thickness and the number of coating layers as well as the type of tool coated, its application and the workpiece material to be machined with said tool for various examples.

In the examples, coating layers that each have at least substantially the same thickness have been assumed for the sake of simplicity, i.e., for example, with a total coating thickness of 12 μm and 4 coating layers each 3 μm thick.

| No. | Coating | Coating thickness | Number of layers | Tool | Application | Workpiece |
|---|---|---|---|---|---|---|
| 1 | AlTiN | 12 μm | 4 | Indexable inserts | Turning | Steel, cast, stainless steel |
| 2 | AlTiN | 12 μm | 4 | Indexable inserts | Drilling | Steel, cast, stainless steel |
| 3 | AlTiN | 12 μm | 4 | Indexable inserts | Milling | Steel, cast, stainless steel |
| 4 | AlTiN | 12 μm | 4 | Indexable inserts | Grooving | Steel, cast, stainless steel |
| 5 | AlTiN | 4.5 μm | 3 | Solid carbide drills | Drilling | Steel, cast, stainless steel |
| 6 | AlTiN | 3 μm | 3 | Solid carbide drills | Drilling | Steel, cast, stainless steel |
| 7 | AlTiN | 1.5 μm | 3 | Solid carbide drills | Drilling | Steel, cast, stainless steel |
| 8 | AlTiN | 1.0 μm | 3 | Solid carbide drills (micro drills with functional diameter < 1 mm) | Drilling | Steel, cast, stainless steel |
| 9 | AlTiN | 0.6 μm | 3 | Solid carbide drills (micro drills with functional diameter < 1 mm) | Drilling | Steel, cast, stainless steel |
| 10 | AlTiN | 0.6 μm | 3 | Reamers | Reaming | Steel, cast, stainless steel |
| 11 | AlTiN | 3 μm | 3 | Solid carbide milling cutters | Milling | Steel, cast, stainless steel |
| 12 | AlTiN | 1.5 μm | 3 | Solid carbide milling cutters | Milling | Steel, cast, stainless steel |
| 13 | AlTiN | 1.0 μm | 3 | Solid carbide milling cutters (micro milling cutters with functional diameter < 1 mm) | Milling | Steel, cast, stainless steel |
| 14 | AlTiN | 0.6 μm | 3 | Solid carbide milling cutters (micro milling cutters with functional diameter < 1 mm) | Milling | Steel, cast, stainless steel |
| 15 | TiAlSiN | 12 μm | 4 | Indexable inserts | Turning | Stainless steel, titanium alloys, Ni-based alloys |
| 16 | TiAlSiN | 12 μm | 4 | Indexable inserts | Drilling | Stainless steel, titanium alloys, Ni-based alloys |
| 17 | TiAlSiN | 12 μm | 4 | Indexable inserts | Milling | Stainless steel, titanium alloys, Ni-based alloys |
| 18 | TiAlSiN | 12 μm | 4 | Indexable inserts | Grooving | Stainless steel, titanium alloys, Ni-based alloys |
| 19 | TiAlSiN | 4.5 μm | 3 | Solid carbide drills | Drilling | Stainless steel, titanium alloys, Ni-based alloys |
| 20 | TiAlSiN | 3 μm | 3 | Solid carbide drills | Drilling | Stainless steel, titanium alloys, Ni-based alloys |
| 21 | TiAlSiN | 1.5 μm | 3 | Solid carbide drills | Drilling | Stainless steel, titanium alloys, Ni-based alloys |
| 22 | TiAlSiN | 1.0 μm | 3 | Solid carbide drills (micro drills with functional diameter < 1 mm) | Drilling | Stainless steel, titanium alloys, Ni-based alloys |
| 23 | TiAlSiN | 0.6 μm | 3 | Solid carbide drills (micro drills with functional diameter < 1 mm) | Drilling | Stainless steel, titanium alloys, Ni-based alloys |
| 24 | TiAlSiN | 0.6 μm | 3 | Reamers | Reaming | Stainless steel, titanium alloys, Ni-based alloys |
| 25 | TiAlSiN | 3 μm | 3 | Solid carbide milling cutters | Milling | Stainless steel, titanium alloys, Ni-based alloys |
| 26 | TiAlSiN | 1.5 μm | 3 | Solid carbide milling cutters | Milling | Stainless steel, titanium alloys, Ni-based alloys |
| 27 | TiAlSiN | 1.0 μm | 3 | Solid carbide milling cutters (micro milling cutters with functional diameter < 1 mm) | Milling | Stainless steel, titanium alloys, Ni-based alloys |

-continued

| No. | Coating | Coating thickness | Number of layers | Tool | Application | Workpiece |
|---|---|---|---|---|---|---|
| 28 | TiAlSiN | 0.6 μm | 0 | Solid carbide milling cutters (micro milling cutters with functional diameter < 1 mm) | Milling | Stainless steel, titanium alloys, Ni-based alloys |
| 29 | TiB2 | 4 μm | 4 | Indexable inserts | Turning | Aluminum, non-ferrous metals |
| 30 | TiB2 | 4 μm | 4 | Indexable inserts | Drilling | Aluminum, non-ferrous metals |
| 31 | TiB2 | 4 μm | 4 | Indexable inserts | Milling | Aluminum, non-ferrous metals |
| 32 | TiB2 | 4 μm | 4 | Indexable inserts | Grooving | Aluminum, non-ferrous metals |
| 33 | TiB2 | 2 μm | 3 | Indexable inserts | Turning | Aluminum, non-ferrous metals |
| 34 | TiB2 | 2 μm | 3 | Indexable inserts | Drilling | Aluminum, non-ferrous metals |
| 35 | TiB2 | 2 μm | 3 | Indexable inserts | Milling | Aluminum, non-ferrous metals |
| 36 | TiB2 | 2 μm | 3 | Indexable inserts | Grooving | Aluminum, non-ferrous metals |
| 37 | TiB2 | 2 μm | 3 | Solid carbide drills | Drilling | Aluminum, non-ferrous metals |
| 38 | TiB2 | 1 μm | 3 | Solid carbide drills (micro drills with functional diameter < 1 mm) | Drilling | Aluminum, non-ferrous metals |
| 39 | TiB2 | 0.6 μm | 3 | Solid carbide drills (micro drills with functional diameter < 1 mm) | Drilling | Aluminum, non-ferrous metals |
| 40 | TiB2 | 0.6 μm | 3 | Reamers | Reaming | Aluminum, non-ferrous metals |
| 41 | TiB2 | 2 μm | 3 | Solid carbide milling cutters | Milling | Aluminum, non-ferrous metals |
| 42 | TiB2 | 1 μm | 3 | Solid carbide milling cutters (micro milling cutters with functional diameter < 1 mm) | Milling | Aluminum, non-ferrous metals |
| 43 | TiBs | 0.6 μm | 3 | Solid carbide milling cutters (micro milling cutters with functional diameter < 1 mm) | Milling | Aluminum, non-ferrous metals |

Although exemplary embodiments of the method have been given above merely by way of example, a person skilled in the art will recognize that the principle can be applied to various material systems, layer structures, coating types and coating parameters as well as to a wide variety of applications. Although the advantages have been presented above for particularly thick coatings 50, there can also be advantages for thin coatings, for example a coating with a total thickness of less than 1 μm on a very fine drill (micro drill) and formed, for example, of three coating layers each measuring 0.2 μm.

The PVD coating system 10 and, in particular, the assembly of magnetron cathodes 22a, 22b, 22c, 22d therein, as well as the electrical circuitry thereof, should merely be considered as examples. A different number of magnetron cathodes could alternatively be provided inside the vacuum chamber 12. Different cathodes could be connected to different types of electrical power supply, for example also to pure DC power supplies. As shown, the power supplies could be connected to the chamber wall or, alternatively, a separate anode that is electrically isolated from the chamber wall could be provided. For DC of the magnetron cathodes operation, in particular, it is preferable for the magnetron cathodes to be connected to an anode of this kind.

The invention claimed is:
1. A method for coating a substrate, wherein
in a first method step, the substrate is pretreated in an ion etching process which is carried out as a first etching substep with an mf-pulsed bias voltage and a second etching substep with a constant DC bias voltage,
in a second method step, a first coating layer with a thickness of 0.1 μm to 6 μm is deposited on the substrate by means of a HIPIMS PVD cathode sputtering process using HIPIMS pulses applied to a cath- ode, the HIPIMS PVD cathode sputtering process being carried out while a DC bias voltage is applied to the substrate in bias pulses, said bias pulses being temporally synchronized with the HIPIMS pulses applied to the cathode, in a third method step, the surface of the first coating layer is treated by means of an ion etching process, in a fourth method step, at least one additional coating layer with a thickness of 0.1 µm to 6 µm is deposited on the first coating layer by means of a PVD cathode sputtering process, wherein the thickness of the coating layers deposited on top of each other is 12 µm to 30 µm in total, wherein an interface region is formed between the first coating layer and the additional coating layer thereon, wherein the structure of the additional coating layer adjoining the interface region is finer than the structure of the first coating layer adjoining the interface region, and wherein the thicknesses of the first coating layer and the at least one additional coating layer differ by less than +/−50%.

2. The method according to claim 1, characterized in that following on from the fourth method step, once or multiple times, initially, the surface of the uppermost coating layer is treated by means of an ion etching process, and subsequently, an additional coating layer is deposited on the underlying coating layer by means of the PVD cathode sputtering process.

3. The method according to claim 1, characterized in that at least the second, third and fourth method step are performed without the vacuum being interrupted.

4. The method according to claim 1, characterized in that a bias voltage is applied to the substrate in each case in the first, second, third and fourth method step, wherein the bias voltage is higher in the third method step than in the second and fourth method step.

5. The method according to claim 1, characterized in that metal ions are generated during the ion etching process and accelerated by means of a bias voltage towards the substrate surface.

6. The method according to claim 1, characterized in that one or more of the coating layers at least substantially comprises a composition selected from the group comprising Al—Ti—N,
Ti—B,
Ti—Si—N,
Al—Ti—Si—N,
Ti—C—N,
Ti—Al—C—N,
Al—Ti—Cr—Si—N.

7. The method according to claim 1, characterized in that a plurality of the coating layers are produced from the same elements.

8. The method according to claim 1, characterized in that the substrate is a tool having at least one cutting edge.

* * * * *